United States Patent
Chiang et al.

(10) Patent No.: US 12,376,347 B2
(45) Date of Patent: Jul. 29, 2025

(54) FERROELECTRIC MEMORY DEVICE AND METHOD OF FORMING THE SAME

(71) Applicant: Taiwan Semiconductor Manufacturing Company, Ltd., Hsinchu (TW)

(72) Inventors: Kuo-Chang Chiang, Hsinchu (TW); Yu-Chuan Shih, Hsinchu (TW); Chun-Chieh Lu, Taipei (TW); Po-Ting Lin, Taichung (TW); Hai-Ching Chen, Hsinchu (TW); Sai-Hooi Yeong, Hsinchu County (TW); Yu-Ming Lin, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 154 days.

(21) Appl. No.: 17/886,472

(22) Filed: Aug. 12, 2022

(65) Prior Publication Data
US 2024/0055517 A1 Feb. 15, 2024

(51) Int. Cl.
*H10B 51/30* (2023.01)
*H10D 30/01* (2025.01)
*H10D 30/69* (2025.01)
*H10D 64/68* (2025.01)

(52) U.S. Cl.
CPC .......... *H10D 30/701* (2025.01); *H10B 51/30* (2023.02); *H10D 30/0415* (2025.01); *H10D 64/689* (2025.01)

(58) Field of Classification Search
CPC ............. H01L 29/78391; H01L 29/516; H01L 29/6684; H10B 51/30; H10D 30/701; H10D 30/0415; H10D 64/689
USPC ........................................................ 257/295
See application file for complete search history.

(56) References Cited

U.S. PATENT DOCUMENTS

| | | | | |
|---|---|---|---|---|
| 5,623,439 | A | * | 4/1997 | Gotoh ............... H01L 29/78391 257/295 |
| 6,828,245 | B2 | * | 12/2004 | Chang ............... H01L 21/31144 438/724 |
| 8,772,109 | B2 | | 7/2014 | Colinge |
| 8,785,285 | B2 | | 7/2014 | Tsai et al. |
| 8,816,444 | B2 | | 8/2014 | Wann et al. |
| 8,823,065 | B2 | | 9/2014 | Wang et al. |
| 8,860,148 | B2 | | 10/2014 | Hu et al. |
| 9,105,490 | B2 | | 8/2015 | Wang et al. |
| 9,236,267 | B2 | | 1/2016 | De et al. |
| 9,236,300 | B2 | | 1/2016 | Liaw |
| 9,520,482 | B1 | | 12/2016 | Chang et al. |
| 9,576,814 | B2 | | 2/2017 | Wu et al. |
| 10,276,697 | B1 | * | 4/2019 | Lu ........................ H10D 64/033 |

(Continued)

*Primary Examiner* — Sheikh Maruf
(74) *Attorney, Agent, or Firm* — JCIPRNET (57) ABSTRACT

Provided are a ferroelectric memory device and a method of forming the same. The ferroelectric memory device includes: a gate electrode; a ferroelectric layer, disposed on the gate electrode; a channel layer, disposed on the ferroelectric layer; a pair of source/drain (S/D) electrodes, disposed on the channel layer; a first insertion layer, disposed between the gate electrode and the ferroelectric layer; and a second insertion layer, disposed between the ferroelectric layer and the channel layer, wherein the second insertion layer has a thickness less than a thickness of the first insertion layer.

12 Claims, 8 Drawing Sheets

(56) References Cited

U.S. PATENT DOCUMENTS

| | | | |
|---|---|---|---|
| 11,557,629 B2* | 1/2023 | Oguz | H10N 50/85 |
| 2006/0046449 A1* | 3/2006 | Liaw | H01L 29/6656 |
| | | | 257/E21.507 |
| 2007/0252127 A1* | 11/2007 | Arnold | H10N 70/821 |
| | | | 257/4 |
| 2009/0068835 A1* | 3/2009 | La Tulipe, Jr. | H01L 23/481 |
| | | | 257/E21.249 |
| 2012/0098073 A1* | 4/2012 | Yu | H01L 21/76802 |
| | | | 257/288 |
| 2013/0037948 A1* | 2/2013 | Samoilov | H01L 24/83 |
| | | | 257/E23.021 |
| 2013/0234203 A1* | 9/2013 | Tsai | H10D 30/797 |
| | | | 257/190 |
| 2013/0277746 A1* | 10/2013 | Baldauf | H10D 84/0193 |
| | | | 257/E21.409 |
| 2015/0171084 A1* | 6/2015 | Lin | H01L 21/32135 |
| | | | 257/369 |
| 2015/0187896 A1* | 7/2015 | Kamineni | H01L 21/28518 |
| | | | 438/666 |
| 2016/0013186 A1* | 1/2016 | Bae | H01L 29/42392 |
| | | | 257/288 |
| 2016/0049397 A1* | 2/2016 | Chang | H01L 27/092 |
| | | | 257/329 |
| 2016/0181259 A1* | 6/2016 | Van Houdt | H10B 51/30 |
| | | | 257/295 |
| 2018/0190809 A1* | 7/2018 | Huang | H01L 27/0886 |
| 2018/0286987 A1* | 10/2018 | Lee | H01L 29/66969 |
| 2020/0105897 A1* | 4/2020 | Hsu | H01L 21/0228 |
| 2020/0176457 A1* | 6/2020 | Sharma | H01L 29/4908 |
| 2020/0203499 A1* | 6/2020 | Chang | H10D 30/699 |
| 2020/0328287 A1* | 10/2020 | Chen | H10D 30/701 |
| 2021/0035989 A1* | 2/2021 | Lee | H10D 64/689 |
| 2021/0083121 A1* | 3/2021 | Heo | H10D 30/751 |
| 2021/0193811 A1* | 6/2021 | Moon | H01L 21/02356 |
| 2021/0280721 A1* | 9/2021 | Gros-Jean | H10D 64/691 |
| 2021/0313439 A1* | 10/2021 | Lee | H01L 29/4908 |
| 2021/0398993 A1* | 12/2021 | Haratipour | H10B 53/30 |
| 2023/0008261 A1* | 1/2023 | Sharma | H01L 29/78391 |
| 2023/0080212 A1* | 3/2023 | Connor | H01L 29/7869 |
| | | | 257/42 |
| 2023/0200081 A1* | 6/2023 | Sen Gupta | H01L 29/78391 |
| | | | 257/43 |
| 2023/0223475 A1* | 7/2023 | Sharma | H01L 29/7869 |
| | | | 257/295 |
| 2023/0276634 A1* | 8/2023 | Ha | H01L 29/78696 |
| | | | 257/295 |
| 2024/0032303 A1* | 1/2024 | Woo | H10B 51/20 |

* cited by examiner

FERROELECTRIC MEMORY DEVICE AND METHOD OF FORMING THE SAME

BACKGROUND

Non-volatile memory device, in contrast to volatile memory device, can retain stored data even after removal of power supply. Ferroelectric memory device is a type of the non-volatile memory device, and includes a ferroelectric material for storing permanent dipole moment. Further, polarity of such dipole moment stored in the ferroelectric material can be switched by adjusting an applied electrical field. Accordingly, binary data "1", "0" can be stored as polarizations with different polarities.

Ferroelectric field effect transistor (FET) is a type of the ferroelectric memory device that resembles a typical FET, except that a ferroelectric material is sandwiched between a gate terminal and a channel region. The polarizations with different polarities stored in the ferroelectric material may affect a threshold voltage of the ferroelectric FET, and can be non-destructively read out by sensing a channel resistance of the ferroelectric FET.

However, the ferroelectric FET development always suffered the oxygen defect generation to result in the device degradation, thereby inducing the serious reliability issue. Such oxygen defect might be caused by intermixing between the oxide semiconductor (OS) channel and the ferroelectric layer due to oxygen migration. A large amount of oxygen defects at interface would provide a pathway for electron, thereby inducing the device degradation with polarization decay and poor device endurance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1A:
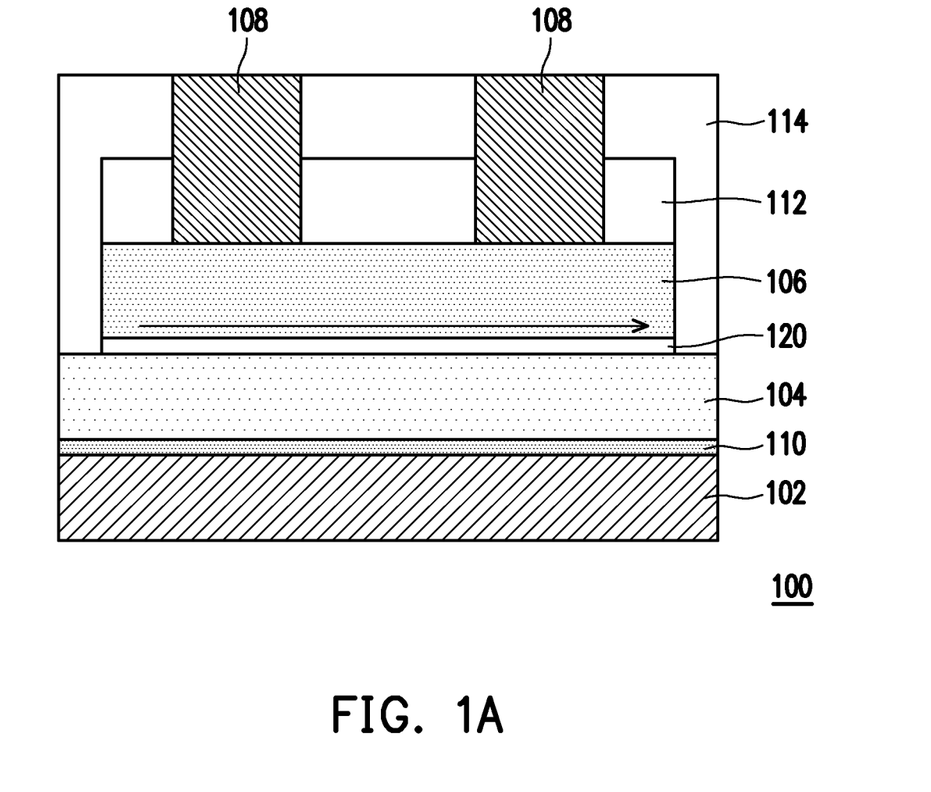
FIG. 1A is a cross-sectional view schematically illustrating a ferroelectric memory device according to some embodiments of the present disclosure.

FIG. 1A is a cross-sectional view schematically illustrating a ferroelectric memory device 100 according to some embodiments of the present disclosure.

Referring to FIG. 1A, the ferroelectric memory device 100 is a ferroelectric FET with a bottom gate configuration. Specifically, the ferroelectric memory device 100 may include a gate electrode 102, a ferroelectric layer 104, a channel layer 106, and a pair of source/drain (S/D) electrodes 108. In some embodiments, ferroelectric layer 104 is disposed on the gate electrode 102, and the channel layer 106 is disposed on the ferroelectric layer 104. That is, the gate electrode 102 may lie below a channel layer 106 to form the bottom gate. In some embodiments, the pair of S/D electrodes 108 are disposed on the channel layer 106 and separately in contact with the channel layer 106. Further, a ferroelectric layer 104 is sandwiched between the gate electrode 102 and the overlying channel layer 106. The ferroelectric layer 104 can store binary data as polarizations with different polarities by adjusting an electric field across the ferroelectric layer 104, and alter a threshold voltage as well as a channel resistance of the ferroelectric memory device 100. By sensing the channel resistance, the binary data stored in the ferroelectric memory device 100 can be read out.

In some embodiments, the ferroelectric memory device 100 is embedded in a back-end-of-line (BEOL) structure of a device die. Although not shown, a front-end-of-line (FEOL) structure including active devices (e.g., metal-oxide-semiconductor (MOS) FETs formed on a semiconductor substrate (e.g., a semiconductor wafer) lies below the BEOL structure, and some conductive features in the BEOL structure interconnect the underlying active devices, to form an integrated circuit. In these embodiments, as a planar type ferroelectric FET, the gate electrode 102 may be formed in one of a stack of dielectric layers in the BEOL structure. The conductive features for interconnecting the underlying active devices may be formed elsewhere in the stack of the dielectric layers. The gate electrode 102 is formed of a conductive material. For instance, the conductive material may include Cu, Pt, Au, Ti, TiN, TiC, Ta, TaN, W, $WN_x$, $WSi_x$, Fe, Ni, Be, Cr, Co, Sb, Ir, Nb, Mo, Os, Th, V, Ru, $RuO_x$ or combinations thereof. In some embodiments, a thickness of the gate electrode 102 ranges from about 5 nm to about 50 nm.

The ferroelectric layer 104 lies over the gate electrode 102. In some embodiments, the ferroelectric layer 104 globally covers the gate electrode 102, and is overlapped with the gate electrode 102. The ferroelectric layer 104 is formed of a ferroelectric material. As an example, the ferroelectric material may include hafnium zirconium oxide (HfZrO or HZO). In some embodiments, the HfZrO may be presented as $Hf_xZr_yO_z$, where x:y:z may be 1:1:4. In some embodiments, X:Y may be between 6:4 and 4:6. In the present embodiment, the HfZrO may be presented as $Hf_{0.5}Zr_{0.5}O_2$. Further, the HfZrO may be doped with elements with smaller ion radius or elements with larger ion radius, in order to enhance ferroelectric polarization. The elements with smaller ion radius may include Al or Si, while the elements with larger ion radius may include La, Sc, Ca, Ba, Gd, Y, Sr or the like. Moreover, oxygen vacancies may be formed in the HfZrO. As another example, the ferroelectric material may include aluminum nitride (AlN) doped Sc (AlN:Sc) or hafnium oxide ($HfO_x$). In some embodiments, a thickness of the ferroelectric layer 104 ranges from 3 nm to 15 nm.

It should be noted that the ferroelectric memory device 100 further includes a first insertion layer 110 disposed between the gate electrode 102 and the ferroelectric layer 104. In some embodiments, the first insertion layer 110 is in direct contact the gate electrode 102 and the ferroelectric layer 104. A material of the first insertion layer 110 may be selected to reduce a lattice mismatch at an interface defined between the ferroelectric layer 104 and the gate electrode 102, thereby enhancing a crystalline quality of the ferroelectric layer 104. In some embodiments, the material of the first insertion layer 110 includes a material with small bandgap, such as metal oxide, noble metal, alloy with super highly dopant, the like, or a combination thereof, for the better electric field control. In the specific embodiment, the material of the first insertion layer 110 includes included NbO, SbO, InO, InZnO, InSnO, Pt, Au, Ag, TiMo, NiTiAl, CuMgAl, or a combination thereof. In addition, a thickness of the first insertion layer 110 may be less than or substantially equal to 3 nm, such as in a range of 0 nm to 3 nm. In some alternative embodiments, the first insertion layer 110 may be amorphous or crystallized. Although the first insertion layer 110 illustrated in FIG. 1A is a single-layered structure, the embodiments of the present invention are not limited thereto. In other embodiments, the first insertion layer 110 may be a bi-layered structure or multi-layered structure with the same material or different materials.

In some alternative embodiments, the first insertion layer 110 is formed by a selected material with a preferred crystalline phase, to promote an orthorhombic phase (O-phase) of the ferroelectric layer 104, and to inhibit a monoclinic phase (M-phase) of the ferroelectric layer 104. The increased O-phase of the ferroelectric layer 104 may result in a higher ferroelectric polarization. In those embodiments where the ferroelectric layer 104 is formed of HfZrO, the first insertion layer 110 may be formed of zirconium oxide (e.g., $ZrO_2$), and may be crystallized to the O-phase or a tetragonal phase (T-phase), to increase an O-phase fraction of the ferroelectric layer 104. The O-phase, the T-phase, a cubic phase (C-phase) and the M-phase may coexist in the ferroelectric layer 104 formed of HfZrO. By using the first insertion layer 110 with a preferred crystalline phase (e.g., the O-phase or the T-phase) as a growth template of the ferroelectric layer 104, a total phase fraction of the O-phase, the T-phase and the C-phase (represented by "(O+T+C)") in the ferroelectric layer 104 may be increased. For instance, the (O+T+C) in the ferroelectric layer 104 may be greater than 50% of the M-phase fraction in the ferroelectric layer 104. As another indicator, a ratio of the (O+T+C) over a total phase fraction of the O-phase, the T-phase, the C-phase and the M-phase (represented by "(O+T+C+M)") may be increased by using the first insertion layer 110 with the preferred crystalline phase as the growth template of the ferroelectric layer 104. Other available materials for the first insertion layer 110 as the growth template of the HfZrO ferroelectric layer 104 may include yttrium oxide (e.g., $Y_2O_3$), zirconium yttrium oxide (ZYO), aluminum oxide (e.g., $Al_2O_3$), tantalum oxide (e.g., $Ta_2O_5$), hafnium zirconium oxide (e.g., $Hf_xZr_yO_z$, where X:Y:Z may be 1:1:4) and hafnium oxide (e.g., $HfO_x$, where the "x" from 1 to 2). In alternative embodiments where the ferroelectric layer 104 is formed of AlN:Sc, the first insertion layer 110 may be formed of aluminum nitride (AlN). Further, each of these material alternatives for the first insertion layer 110 may be crystallized to the C-phase, the T-phase, the O-phase or combinations thereof.

The channel layer 106 lies over the ferroelectric layer 104, and may be formed of a semiconductor material. The semiconductor material may be an oxide semiconductor material, a group IV semiconductor material or a group III-V semiconductor material. For instance, the oxide semiconductor material may include indium-gallium-zinc-oxide (IGZO), tin oxide ($SnO_x$), indium oxide ($InO_x$), gallium oxide (e.g., $Ga_2O_3$), zinc oxide (e.g., ZnO), magnesium oxide (e.g., MgO), gadolinium oxide (e.g., GdO) or in any binary-, ternary-, quaternary-combinations. Indium-zinc-oxide (InZnO) may be one of the binary combination examples. Tin-gallium-zinc-oxide (SnGaZnO) and tin-indium-zinc-oxide (SnInZnO) may be two of the ternary combination examples, and tin-indium-gallium-zinc-oxide (SnInGaZnO) may be one of the quaternary combination examples. On the other hand, the group IV semiconductor material may include Si and/or SiGe, and the group III-V semiconductor material may include GaN, GaAs or InGaAs. In some embodiments, the channel layer 106 is formed of amorphous IGZO, with a thickness ranging from 3 nm to 20 nm.

In some embodiments, the ferroelectric memory device 100 further includes a second insertion layer 120 disposed between the ferroelectric layer 104 and the overlying channel layer 106. The second insertion layer 120 may be in direct contact with the underlying ferroelectric layer 104 and the overlying channel layer 106. The second insertion layer 120 may include a material selected to enhance conduction band offset ($V_{CBO}$) and valence band offset ($V_{VBO}$) with respect to conduction and valence bands of the channel layer 106, in order to increase a potential barrier between the ferroelectric layer 104 and the channel layer 106. Accordingly, leakage current entering the ferroelectric layer 104 from the channel layer 106 can be reduced by disposing the second insertion layer 120. In some embodiments, the second insertion layer 120 may include an oxide ferroelectric material. For instance, the oxide ferroelectric material may include hafnium oxide ($HfO_x$) or zirconium oxide (ZrO$_x$), and may be doped with materials with higher bandgap (i.e., higher than bandgap of the semiconductor material for forming the channel layer 106). These materials incorporated in the oxide ferroelectric material may include titanium oxide (e.g., TiO), gallium oxide (e.g., GaO), hafnium oxide (HfO$_x$), zirconium oxide (ZrO$_x$), magnesium oxide (e.g., MgO), aluminum oxide (e.g., AlO), silicon oxide (e.g., SiO), a combination thereof or other candidates having bandgap greater than the bandgap of the channel layer 106. In alternative embodiments, the second insertion layer 120 may be respectively formed of a non-ferroelectric material, such as a dielectric material. In addition, a thickness of the second insertion layer 120 may be less than or substantially equal to 3 nm, such as in a range of 0 nm to 3 nm. In some alternative embodiments, the second insertion layer 120 may be amorphous or crystallized. Although the second insertion layer 120 illustrated in FIG. 1A is a single-layered structure, the embodiments of the present invention are not limited thereto. In other embodiments, the second insertion layer 120 may be a bi-layered structure or multi-layered structure with the same material or different materials.

It should be noted that, in the present embodiment, the first insertion layer 110 and the second insertion layer 120 are in an asymmetrical configuration. That is, the first insertion layer 110 and the second insertion layer 120 may have different thicknesses, different materials, or different properties. Specifically, the first insertion layer 110 may have a thickness greater than a thickness of the second insertion layer 120, and the first insertion layer 110 may have a conductivity greater than a conductivity of the second insertion layer 120. In such embodiment, the first insertion layer 110 with the better conductivity may suppress the interfacial layer formation and reduce the Schottky barrier between the gate electrode 102 and the ferroelectric layer 104 for the better electric field control, while improving the crystalline quality of the ferroelectric layer 104. In the present embodiment, the thickness of the first insertion layer 110 is intentionally designed to be less than 3 nm or even not observed, so that the voltage drop issue will not occur at the interface between the gate electrode 102 and the ferroelectric layer 104. That is, when the thickness of the first insertion layer 110 is greater than 3 nm, the voltage drop issue may be occurred at the interface between the gate electrode 102 and the ferroelectric layer 104. Herein, the first insertion layer 110 may be referred to as a buffer layer or a seed layer.

On the other hand, the second insertion layer 120 may have the better thermal stability and the better metal-oxygen bonding capability than the channel layer 106. In this case, the second insertion layer 120 may prevent the oxygen atoms of the channel layer 106 from diffusing into the ferroelectric layer 104 without forming an undesired intermixing interface or interfacial layer with oxygen vacancy. A large amount of the oxygen vacancy at interface would provide a pathway for electron, so as to induce the device degradation with polarization decay and poor device endurance. As such, the second insertion layer 120 sandwiched between the ferroelectric layer 104 and the channel layer 106 may improve the performance and the endurance of the memory device. In the present embodiment, the thickness of the second insertion layer 120 is intentionally designed to be less than 3 nm or even not observed, so that the voltage drop issue will not occur at the interface between the ferroelectric layer 104 and the channel layer 106. That is, when the thickness of the second insertion layer 120 is greater than 3 nm, the voltage drop issue may be occurred at the interface between the ferroelectric layer 104 and the channel layer 106. Accordingly, the thinner second insertion layer 120 may not affect the electric field control between the ferroelectric layer 104 and the channel layer 106 for better device performance. Herein, the second insertion layer 120 may be referred to as a barrier layer.

Further, compared with the symmetry configuration, the asymmetrical configuration of the present embodiment can achieve the stable device reliability, even under long term operation to $1\times10^{11}$ cycles.

The S/D electrodes 108 may be disposed on the channel layer 106 and laterally surrounded by a cap layer 112 and a dielectric layer 114. In some embodiments, the S/D electrodes 108 is in direct contact the channel layer 106 and separated from each other by the cap layer 112 and the dielectric layer 114. The S/D electrodes 108 are formed of a conductive material. For instance, the conductive material may include Cu, Pt, Au, Ti, TiN, TiC, Ta, TaN, W, WN$_x$, WSi$_x$, Fe, Ni, Be, Cr, Co, Sb, Ir, Nb, Mo, Os, Th, V, Ru, RuO$_x$ or combinations thereof. In some embodiments, a thickness of the S/D electrodes 108 ranges from about 5 nm to about 50 nm.

Figure 1B:
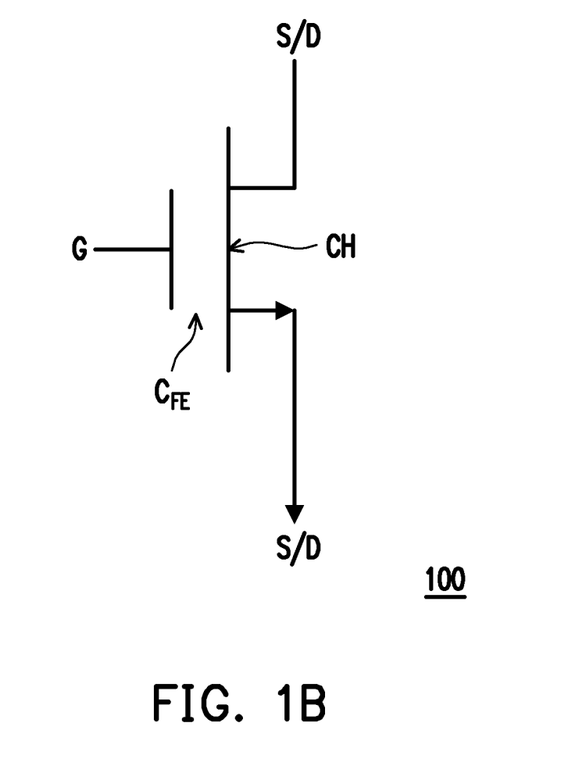
FIG. 1B is a circuit diagram of the ferroelectric memory device as shown in FIG. 1A.

FIG. 1B is a circuit diagram of the ferroelectric memory device 100 as shown in FIG. 1A.

Referring to FIG. 1A and FIG. 1B, the ferroelectric memory device 100 may be a ferroelectric FET. The gate electrode 102 may be functioned as a gate terminal G of the ferroelectric FET, and the S/D electrodes 108 may be functioned as S/D terminals S/D of the ferroelectric FET. A conduction channel CH extending between the S/D terminals S/D may be established when the ferroelectric FET is turned on, and may be cut off or absent when the ferroelectric FET is in an off state. As described with reference to FIG. 1A, the conduction channel CH may be established in the channel layer 106. The gate terminal G is capacitively coupled to the conduction channel CH through a gate capacitor $C_{FE}$, and configured to control formation of the conduction channel CH. The gate capacitor $C_{FE}$ is formed across layers including the ferroelectric layer 104, thus may be referred as a ferroelectric capacitor $C_{FE}$.

Although not shown, the ferroelectric memory device 100 may be a single memory cell in a memory array. In some embodiments, the memory array is a two-dimensional memory that includes columns and rows of the ferroelectric memory devices 100 deployed at a single horizontal level. In alternative embodiments, the memory array is a three-dimensional memory that includes stacks of the ferroelectric memory devices 100. In these alternative embodiments, the ferroelectric memory devices 100 in each stack are arranged along a vertical direction.

Figure 2:
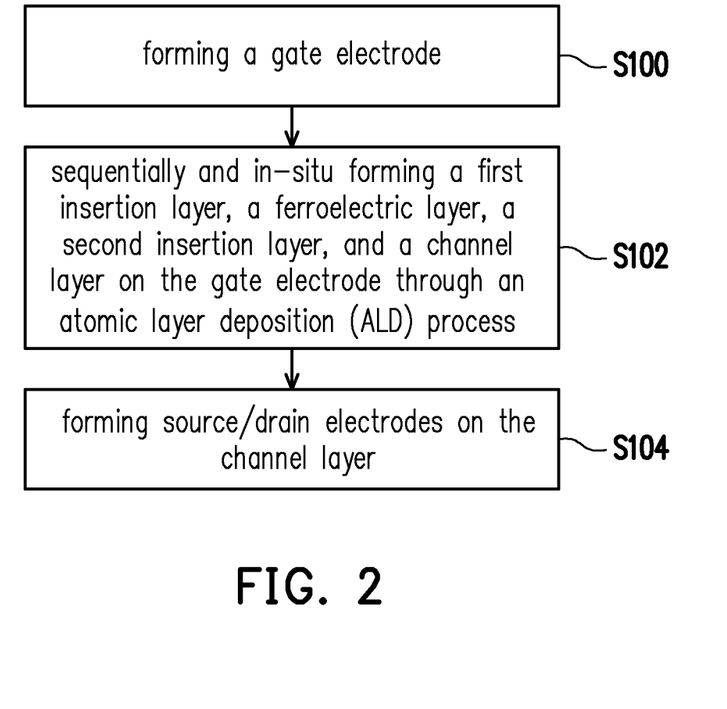
FIG. 2 is a flow diagram illustrating a method for forming the ferroelectric memory device as shown in FIG. 1A, according to some embodiments of the present disclosure.

FIG. 2 is a flow diagram illustrating a method for forming the ferroelectric memory device 100 as shown in FIG. 1A, according to some embodiments of the present disclosure. FIG. 3A through FIG. 3F are cross-sectional views illustrating intermediate structures during the manufacturing process as shown in FIG. 2.

Figure 3A:
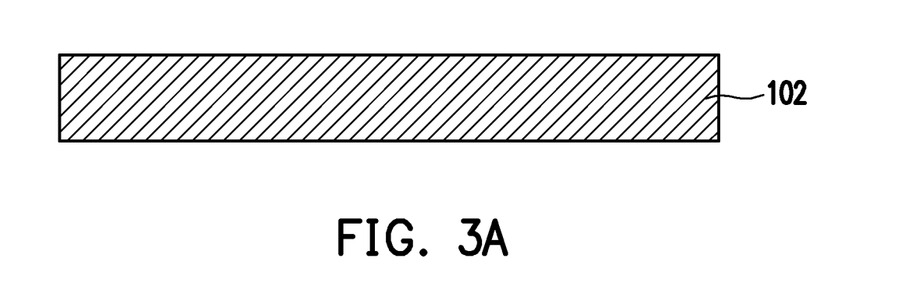
FIG. 3A through FIG. 3F are cross-sectional views illustrating intermediate structures during the manufacturing process as shown in FIG. 2.

Referring to FIG. 2 and FIG. 3A, a step S100 is performed, and the gate electrode 102 is formed. In some embodiments, the gate electrode 102 is formed in a dielectric layer (not shown) which is one of a stack of dielectric layers in a BEOL structure formed over a FEOL structure including active devices disposed on a semiconductor substrate. In addition, the gate electrode 102 may be a portion of a metallization layer formed in the stack of dielectric layers of the BEOL structure. In such embodiment, the gate electrode 102 may be referred to as word line (WL). In some embodiments, a damascene process may be used for forming the dielectric layer 108 and the gate electrode 102. The damascene process described in the present disclosure may include depositing a dielectric layer, forming at least one trench/hole in the dielectric layer, filling a conductive material in the trench/hole, and performing a planarization process to remove portions of the conductive material over the dielectric layer. For instance, the planarization process may include a polishing process, an etching process or a combination thereof.

Figure 3B:
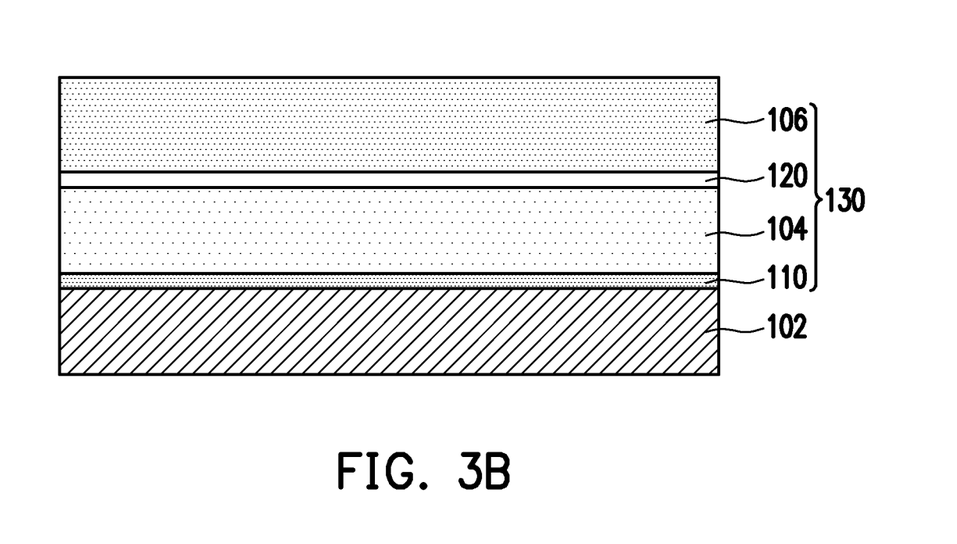

Referring to FIG. 2 and FIG. 3B, a step S102 is then performed. The first insertion layer 110, the ferroelectric layer 104, the second insertion layer 120, and the channel layer 106 are sequentially and in-situ formed on the gate electrode 102 through an atomic layer deposition (ALD) process. Herein, the term "in-situ" refers to performing a plurality of ALD processes in the same processing system or the single ALD tool. In other words, the structure with the gate electrode 102 shown in FIG. 3A may be at the same chamber in the same process tool during the depositing the first insertion layer 110, the ferroelectric layer 104, the second insertion layer 120, and the channel layer 106 and allows to remain under a vacuum condition. Accordingly, the structure with the gate electrode 102 is not exposed to an external ambient or an oxygen-containing ambient during forming the ferroelectric layer 104, the second insertion layer 120, and the channel layer 106.

In some embodiments, since the first insertion layer 110, the ferroelectric layer 104, the second insertion layer 120, and the channel layer 106 are in-situ formed in the same chamber, the first insertion layer 110, the ferroelectric layer 104, the second insertion layer 120, and the channel layer 106 are collectively referred to as a cluster material 130. In the cluster material 130, the ferroelectric layer 104 is protected by the first insertion layer 110 and the second insertion layer 120. In such embodiment, no undesired intermixing interface or undesired oxygen vacancy is formed at the interface between the first insertion layer 110 and the ferroelectric layer 104 and/or the interface between the ferroelectric layer 104 and the second insertion layer 120. That is, the first insertion layer 110 and the second insertion layer 120 are able to reduce the unexpected inter-diffusion or oxygen defect migration between at the interface between the first insertion layer 110 and the ferroelectric layer 104 and/or the interface between the ferroelectric layer 104 and the second insertion layer 120. In addition, with the first and second insertion layer 110 and 120, oxygen vacancy generation and fatigue through intermixing or interfacial layer can be suppressed, thereby improving the endurance of the memory device. In some embodiments, all of the first insertion layer 110, the ferroelectric layer 104, the second insertion layer 120, and the channel layer 106 may be referred to as a single layer without any interface therebetween.

Referring to FIG. 2 and FIG. 3C to FIG. 3F, a step S104 is performed, and the pair of S/D electrodes 108 are formed on the channel layer 106. In detail, a cap layer 112 may be formed on the channel layer 106. In some embodiment, the cap layer 112 includes a dielectric layer such as silicon oxide, silicon nitride, silicon oxynitride, silicon carbide, the like, or a combination thereof. The cap layer 112 may be formed by ALD, chemical vapor deposition (CVD), or any suitable process, and may have a thickness of 1 nm to 20 nm. In some embodiments, the forming the cap layer 112 is an ex-situ process. Herein, the term "ex-situ" refers to performing different deposition processes in different processing systems or tools. In other words, the structure with the cluster material 130 shown in FIG. 3B may be transferred between different process tools. Accordingly, the channel layer 106 is exposed to an external ambient or an oxygen-containing ambient during forming the cap layer 112. In the case, an additional oxide layer (not shown) may be formed between the cap layer 112 and the channel layer 106.

Figure 3C:
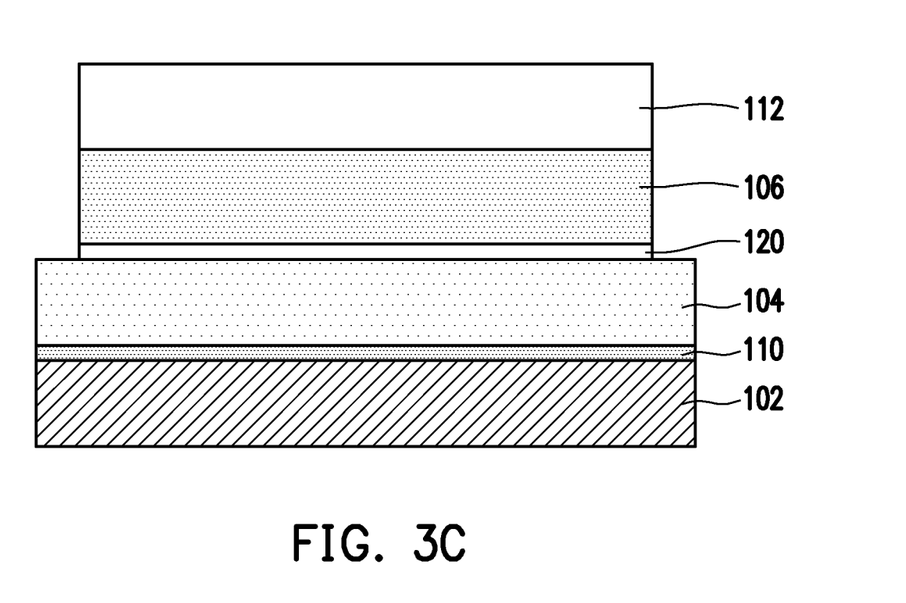

After forming the cap layer 112, the cap layer 112, the channel layer 116, and the second insertion layer 120 are patterned. Specifically, a mask pattern (not shown) is formed on the cap layer 112, an etching process is then performed by using the mask pattern as a mask to remove portions of the cap layer 112, the channel layer 116, and the second insertion layer 120 until exposing the ferroelectric layer 104, and the mask pattern is removed to expose the cap layer 112, as shown in FIG. 3C. In some embodiments, the etching process include a dry etching process or an anisotropic etching process, such as a reactive-ion etching (RIE) process. After the pattern the cap layer 112, the channel layer 116, and the second insertion layer 120, an area within an outermost perimeter of the channel layer 116 is less than an area within an outermost perimeter of the ferroelectric layer 104 in a plan view.

Figure 3D:
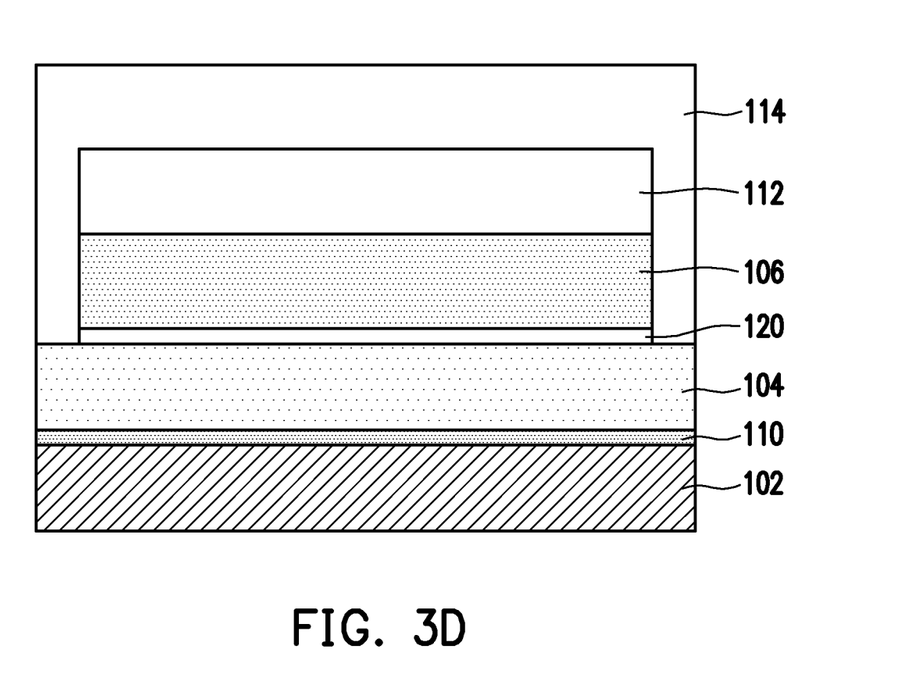

As shown in FIG. 3D, a dielectric layer 114 is then formed on the cap layer 112 to cover the cap layer 112, the channel layer 106, and the second insertion layer 120. The dielectric layer 114 may be referred to as an interlayer dielectric (ILD) layer, hereinafter called ILD layer 114. In some embodiments, the ILD layer 114 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the ILD layer 114 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. In alternative embodiments, the ILD layer 114 include one or more dielectric materials and/or one or more dielectric layers. In some embodiments, the ILD layer 114 is formed to a suitable thickness by Flowable CVD (FCVD), CVD, HDPCVD, SACVD, spin-on, sputtering, or other suitable methods, and may have a thickness of 5 nm to 50 nm.

Figure 3E:
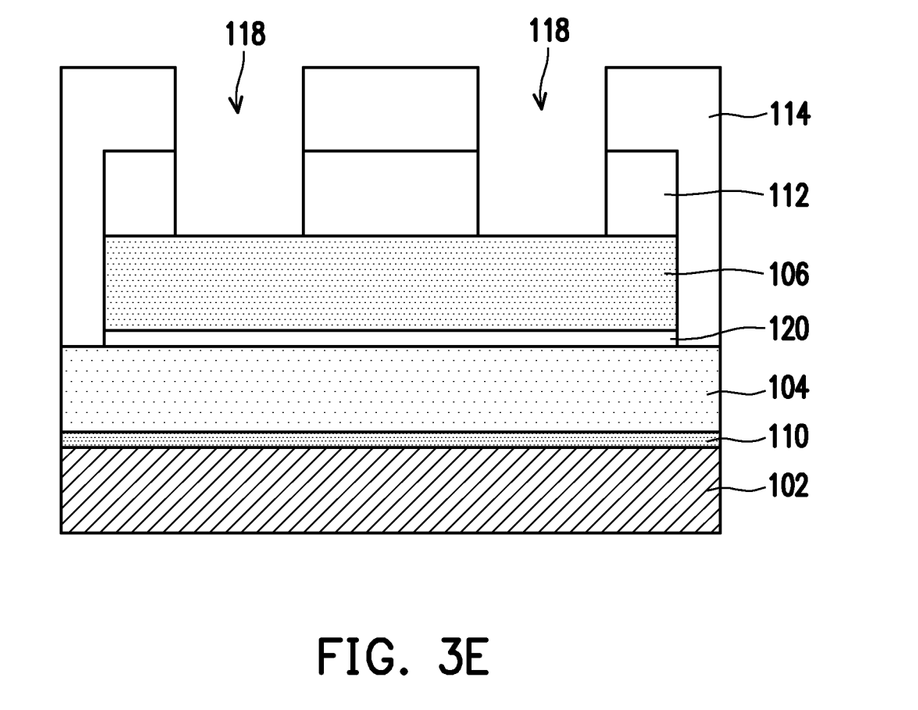

As shown in FIG. 3E, a pair of openings 118 are formed in the ILD layer 114 and the cap layer 112. In some embodiments, the pair of openings 118 expose a portion of the channel layer 106 and are separated from each other by the ILD layer 114 and the cap layer 112. Specifically, a mask pattern (not shown) may be formed on the ILD layer 114, an etching process is then performed by using the mask pattern as a mask to remove portions of the ILD layer 114 and the cap layer 112 until exposing the channel layer 106, and the mask pattern is removed to expose the ILD layer 114. In some embodiments, the etching process include a dry etching process or an anisotropic etching process, such as a RIE process.

Figure 3F:
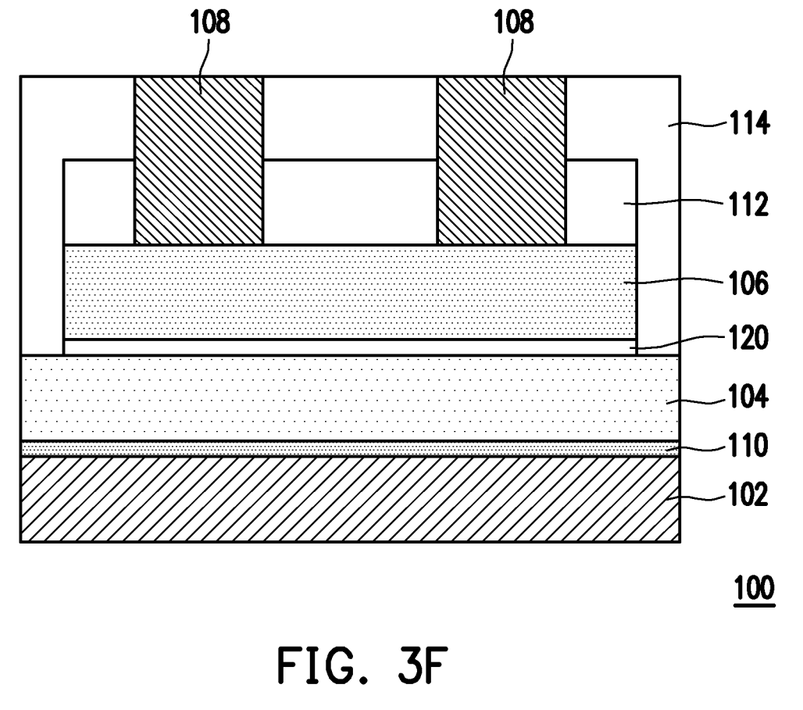

As shown in FIG. 3E and FIG. 3F, the pair of S/D electrodes 118 are formed in the pair of openings 118 respectively. In some embodiments, one of the S/D electrodes 118 may be referred to as source electrode or source line (SL), while the other of the S/D electrodes 118 may be referred to as drain electrode or bit line (BL). Specifically, a conductive material (not shown) is formed on the ILD layer 114 and filled in the pair of openings 118, a planarization process (e.g., CMP process) is performed to remove the excess portion of the conductive material on the ILD layer 114, and the remaining portion of the conductive material in the pair of openings 118 forms the pair of S/D electrodes 108. In some embodiments, the conductive material may include Cu, Pt, Au, Ti, TiN, TiC, Ta, TaN, W, $WN_x$, $WSi_x$, Fe, Ni, Be, Cr, Co, Sb, Ir, Nb, Mo, Os, Th, V, Ru, $RuO_x$ or combinations thereof, and may be formed by CVD, ALD, physical vapor deposition (PVD), or any suitable process. In some embodiments, the pair of S/D electrodes 108 may have a thickness of 5 nm to 50 nm.

Up to here, the ferroelectric memory device 100 as shown in FIG. 3F has been formed. Subsequently, further BEOL process may be performed to out rout the gate electrode 102 as well as the S/D electrodes 108, and to complete formation of the BEOL structure.

Figure 4:
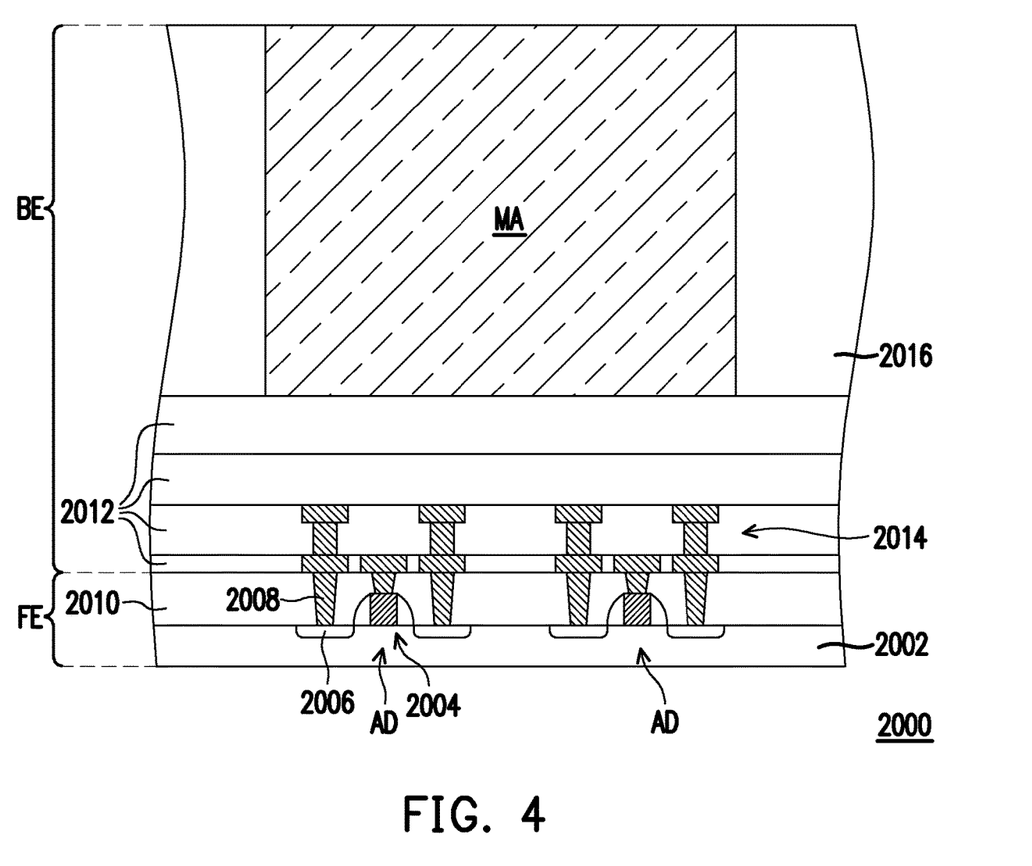
FIG. 4 is a cross-sectional view illustrating a portion of a semiconductor chip, according to some embodiments of the present disclosure.

FIG. 4 is a cross-sectional view illustrating a portion of a semiconductor chip 2000 according to some embodiments of the present disclosure.

Referring to FIG. 4, as described above, a memory array MA including a plurality of ferroelectric memory devices may be embedded in a BEOL structure BE of a semiconductor chip 2000. The memory array MA may be a two-dimensional memory array including a plurality of the ferroelectric memory devices described with reference to FIG. 1A and arranged at the same horizontal level. Alternatively, the memory array MA may be a three-dimensional memory array. The BEOL structure BE is formed on a FEOL structure FE, and includes conductive elements electrically connected to active devices in the FEOL structure FE. In some embodiments, the FEOL structure FE is formed on a surface region of a semiconductor substrate 2002. For instance, the semiconductor substrate 2002 may be a semiconductor wafer or a SOI wafer. The FEOL structure FE may include active devices AD. For conciseness, only two of the active devices AD are depicted. The active devices AD, such as metal-oxide-semiconductor (MOS) FETs, may respectively include a gate structure 2004 and source/drain structures 2006 at opposite sides of the gate structure 2004. In some embodiments, the gate structure 2004 is disposed on a substantially flat surface of the semiconductor substrate 2002, and the source/drain structures 2006 at opposite sides of the gate structure 2004 are formed in shallow regions of the semiconductor substrate 2002. In these embodiments, the active device AD may be referred as a planar-type MOSFET, and a conduction channel may be established in a skin portion of the semiconductor substrate 2002 covered by the gate structure 2004 and extending between the source/drain structures 2006. In alternative embodiments, the active device AD is formed as a fin-type FET (or referred as finFET) or a gate-all-around (GAA) FET. In these alternative embodiments, conduction channels of these FETs may be established in three-dimensional active structures intersected with and covered by gate structures. Further, the FEOL structure FE may include contact plugs 2008 standing on the gate structures 2004 and the source/drain structures 2006, as well as a dielectric layer 2010 laterally surrounding the gate structure 2004 and the contact plugs 2008.

The BEOL structure BE may include a stack of dielectric layers 2012, and include conductive elements 2014 formed in the stack of dielectric layers 2012. The conductive elements 2014 are electrically connected to the active devices AD in the FEOL structure FE, and may also be referred as interconnect structure. The conductive elements 2014 may include conductive traces and conductive vias. The conductive traces respectively extend on one of the dielectric layers 2012, whereas the conductive vias respectively penetrate through one or more of the dielectric layers 2012, and establish electrical contact with one or more of the conductive traces. The memory array MA may be disposed on the stack of the dielectric layers 2012, and terminals of the ferroelectric memory devices in the memory array MA are routed to the underlying conductive elements 2014. Accordingly, the memory array MA can be routed to the active devices AD, and can be driven by these active devices AD. In some embodiments, the memory array MA may be laterally surrounded by at least one dielectric layer 2016. Further, more dielectric layer(s) and conductive elements (both not shown) may be formed on the dielectric layer 2016 and the memory array MA.

In accordance with an embodiment, a ferroelectric memory device includes: a gate electrode; a ferroelectric layer, disposed on the gate electrode; a channel layer, disposed on the ferroelectric layer; a pair of source/drain (S/D) electrodes, disposed on the channel layer; a first insertion layer, disposed between the gate electrode and the ferroelectric layer; and a second insertion layer, disposed between the ferroelectric layer and the channel layer, wherein the second insertion layer has a thickness less than a thickness of the first insertion layer.

In accordance with an embodiment, a method of forming a ferroelectric memory device includes: forming a gate electrode; sequentially and in-situ forming a first insertion layer, a ferroelectric layer, a second insertion layer, and a channel layer on the gate electrode through an atomic layer deposition (ALD) process, wherein the second insertion layer has a thickness less than a thickness of the first insertion layer; and forming a pair of source/drain (S/D) electrodes on the channel layer.

In accordance with an embodiment, a semiconductor chip includes: a semiconductor substrate; a plurality of active devices, disposed on the semiconductor substrate; an interconnect structure, disposed on the plurality of active devices and electrically connected to the plurality of active devices; a memory array, disposed over the interconnect structure, and comprising a plurality of ferroelectric memory devices. One of the plurality of ferroelectric memory devices includes: a gate electrode; a ferroelectric layer, disposed on the gate electrode; a channel layer, disposed on the ferroelectric layer; a pair of source/drain (S/D) electrodes, disposed on the channel layer; a first insertion layer, disposed between the gate electrode and the ferroelectric layer; and a second insertion layer, disposed between the ferroelectric layer and the channel layer, wherein the second insertion layer has a thickness less than a thickness of the first insertion layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A ferroelectric memory device, comprising:
a gate electrode;
a ferroelectric layer, disposed on the gate electrode;
a channel layer, disposed on the ferroelectric layer;
a cap layer, disposed on the channel layer;

a pair of source/drain (S/D) electrodes, penetrating through the cap layer to contact the channel layer;

a first insertion layer, disposed between the gate electrode and the ferroelectric layer; and a second insertion layer, disposed between the ferroelectric layer and the channel layer, wherein the cap layer has a bottom surface in direct contact with a top surface of the channel layer.

2. The ferroelectric memory device according to claim 1, wherein a conductivity of the first insertion layer is greater than a conductivity of the second insertion layer, and the second insertion layer has a thickness less than a thickness of the first insertion layer.

3. The ferroelectric memory device according to claim 1, wherein the second insertion layer has a bandgap higher than a bandgap of the channel layer.

4. The ferroelectric memory device according to claim 1, wherein the first insertion layer is configured to reduce lattice mismatch at an interface defined between the ferroelectric layer and the gate electrode, thereby enhancing a crystalline quality of the ferroelectric layer.

5. The ferroelectric memory device according to claim 1, wherein a material of the first insertion layer comprises: NbO, SbO, InO, InZnO, InSnO, Pt, Au, Ag, TiMo, NiTiAl, CuMgAl, or a combination thereof.

6. The ferroelectric memory device according to claim 1, wherein a thickness of the first insertion layer is less than or substantially equal to 3 nm.

7. The ferroelectric memory device according to claim 1, wherein a material of the second insertion layer comprises: TiO, GaO, HfO, ZrO, MgO, AlO, SiO, or a combination thereof.

8. The ferroelectric memory device according to claim 1, wherein a thickness of the second insertion layer is less than or substantially equal to 3 nm.

9. The ferroelectric memory device according to claim 1, wherein a metal-oxygen bonding capability of the second insertion layer is greater than a metal-oxygen bonding capability of the channel layer.

10. A semiconductor chip, comprising:

a semiconductor substrate;

a plurality of active devices, disposed on the semiconductor substrate;

an interconnect structure, disposed on the plurality of active devices and electrically connected to the plurality of active devices;

a memory array, disposed over the interconnect structure, and comprising a plurality of ferroelectric memory devices, wherein one of the plurality of ferroelectric memory devices comprises:

a gate electrode;

a ferroelectric layer, disposed on the gate electrode;

a channel layer, disposed on the ferroelectric layer;

a cap layer, disposed on the channel layer, wherein the cap layer has a bottom surface in direct contact with a top surface of the channel layer;

a pair of source/drain (S/D) electrodes, penetrating through the cap layer to contact the channel layer;

a first insertion layer, disposed between the gate electrode and the ferroelectric layer; and a second insertion layer, disposed between the ferroelectric layer and the channel layer.

11. The semiconductor chip according to claim 10, wherein a conductivity of the first insertion layer is greater than a conductivity of the second insertion layer, and the second insertion layer has a thickness less than a thickness of the first insertion layer.

12. The semiconductor chip according to claim 10, wherein a metal-oxygen bonding capability of the second insertion layer is greater than a metal-oxygen bonding capability of the channel layer.

\* \* \* \* \*